US007651891B1

(12) United States Patent
Nguyen

(10) Patent No.: US 7,651,891 B1
(45) Date of Patent: Jan. 26, 2010

(54) INTEGRATED CIRCUIT PACKAGE WITH STRESS REDUCTION

(75) Inventor: Luu Thanh Nguyen, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 370 days.

(21) Appl. No.: 11/836,662

(22) Filed: Aug. 9, 2007

(51) Int. Cl.
*H01L 21/00* (2006.01)
*H01L 21/76* (2006.01)

(52) U.S. Cl. ...................................... 438/127; 438/422

(58) Field of Classification Search ....................... None
See application file for complete search history.

(56) References Cited

U.S. PATENT DOCUMENTS

| | | | | |
|---|---|---|---|---|
| H000073 | H * | 5/1986 | Claasen et al. | 257/669 |
| 4,942,456 | A * | 7/1990 | Sako | 257/687 |
| 5,946,556 | A * | 8/1999 | Hashizume | 438/126 |
| 6,093,972 | A * | 7/2000 | Carney et al. | 257/790 |
| 6,238,987 | B1 * | 5/2001 | Lee | 438/305 |
| 6,377,137 | B1 * | 4/2002 | Ruby | 333/189 |
| 6,610,593 | B2 * | 8/2003 | Kohl et al. | 438/623 |
| 6,825,130 | B2 * | 11/2004 | Todd | 438/778 |
| 6,933,605 | B2 | 8/2005 | Tao et al. | |
| 6,965,281 | B2 * | 11/2005 | Sunwoo et al. | 333/133 |
| 7,067,358 | B2 * | 6/2006 | Chen-Tung et al. | 438/127 |
| 7,091,611 | B2 * | 8/2006 | Ahn et al. | 257/758 |
| 2006/0096945 | A1 * | 5/2006 | Shen | 216/2 |
| 2006/0105122 | A1 * | 5/2006 | Hantschel et al. | 428/34.1 |
| 2008/0176362 | A1 * | 7/2008 | Sengupta et al. | 438/123 |

OTHER PUBLICATIONS

Nguyen et al., "Effects of Configuration on Plastic Package Stresses", Journal of Electronic Packaging, Dec. 1991, vol. 113, pp. 397-404.
Joseph et al., "Improved Fabrication of Micro Air-Channels by Incorporation of a Structural Barrier", Journal of Micromechanics and Microengineering, 2005, vol. 15, pp. 35-42.

* cited by examiner

*Primary Examiner*—Scott B Geyer
(74) *Attorney, Agent, or Firm*—Beyer Law Group LLP

(57) ABSTRACT

An integrated circuit package includes a carrier, an integrated circuit die attached to the carrier, and a molding compound surrounding the integrated circuit die. The integrated circuit die includes a bottom surface attached to the carrier, a top surface including at least one stress sensitive area, and side surfaces. The molding compound has a top air cavity formed over the at least one stress sensitive area, and a side air cavity formed on the side surfaces of the integrated circuit die. The integrated circuit package may further include a top structural layer surrounding the top air cavity. The air cavities reduce molding-induced stresses in integrated circuit packages.

13 Claims, 15 Drawing Sheets

48 46 44
60

43 52 72 42

INTEGRATED CIRCUIT PACKAGE WITH STRESS REDUCTION

TECHNICAL FIELD

The present invention relates generally to the packaging of integrated circuits. More specifically, it relates to reducing stresses on selected regions of a semiconductor die in an integrated circuit package.

BACKGROUND OF THE INVENTION

Many conventional semiconductor packaging techniques contemplate the use of an encapsulant that covers at least a portion of the die. One common approach is to form a package by molding a plastic encapsulant material around the die. In other arrangement, epoxies or other adhesive materials may be dispensed over at least the active surface of the die. At the same time, some integrated circuits have sensitive regions that can be adversely affected by stresses caused by the adherence of an encapsulant (e.g., mold compound or epoxies) to the die. Typically, these sensitive regions are found on an active surface of the die.

Stresses in molded integrated circuit packages occur mainly from thermal mismatch between the different materials in the packages. Piezo-resistive test chip measurement showed that the stresses depend on a number of factors, such as package type, die thickness, die size, die pad size, die attachment type, and mold compound type. Imbalance in package configuration also causes bending stresses on the die. Typical assembly process induced stresses are about −10 MPa or more from the die attach, and about −300 MPa from the molding (postmold cure) process. Molding-induced stresses may cause parametric shift including hysteresis after preconfiguration, smearing of unpassivated and passivated aluminum lines, dielectric cracks, pasivation cracks, and the like. FIG. 1 schematically illustrates molding-induced compressive stresses and in-plane shear stresses in a conventional integrated circuit package.

A number of techniques have been used and/or proposed to reduce or prevent such molding-induced stresses. Conventional solutions include, among others, cavity packages, low stress mold compounds, redesigned leadframes, and soft overcoats. Cavity packages are expensive solutions due to the high cost of pre-molded cavity packages and cavity ceramic packages, yet presenting stresses from die attachment about −10 MPa or more. Using a low stress mold compound achieves only a small extent of stress reduction due to the limitation of flexibilizers, filler type, and filler content that need to be altered. Redesigning leadframes includes use of anchors, selective plating, leadframe micro etching, and the like to enhance interfacial adhesion, whose effect on stress reduction is limited. Soft overcoats such as silicon or polyimide are used for glob top or in photo-sensitive coatings to act as stress buffers. However, such coatings can only reduce in-plane stresses and thus compressive and bending-induced stresses are still present. For example, stresses about −40 to +80 MPa from die attachment and mold compound are still present in some applications.

SUMMARY OF THE INVENTION

The present invention reduces or minimizes the molding-induced stresses by creating an air cavity around the semiconductor device inside a semiconductor package.

In an aspect of the invention, an integrated circuit package includes a carrier, an integrated circuit die attached to the carrier, and a molding compound surrounding the integrated circuit die. The carrier may be a leadframe strip, an organic substrate, or an inorganic (e.g., ceramic) substrate. The integrated circuit die includes a bottom surface attached to the carrier, a top surface including at least one stress sensitive area, and side surfaces. The molding compound includes a top air cavity formed over at least one stress sensitive area, and a side air cavity formed on the side surfaces of the integrated circuit die. The integrated circuit package may further include a top structural layer surrounding the top air cavity.

In another aspect of the invention, a method creates an air cavity in a molding compound for an integrated circuit die. The method includes (a) coating a thermally decomposable material on a wafer including a plurality of integrated circuit units, (b) patterning the coated material into a sacrificial layer such that the sacrificial layer covers a desired portion of each integrated circuit unit, (c) coating a polymer material on the wafer over the sacrificial layer, (d) patterning the polymer material into a structural layer covering the sacrificial layer, (e) sawing the wafer into individual dice, each die including a corresponding integrated circuit unit, (f) attaching dice to a carrier and providing electrical connections, (g) covering the dice on the carrier with an encapsulant material, and (h) heating the encapsulant material, wherein the sacrificial layer decomposes and outgasses through the structural layer and the encapsulant material, thereby leaving an air cavity.

In yet another aspect of the invention, a method creates an air cavity in a molding compound for an integrated circuit die, where the method includes (a) partially dicing a wafer including a plurality of integrated circuit units on a top surface thereof to form grooves between adjacent integrated circuit units, (b) coating a thermally decomposable material on the wafer, the material filling the grooves, (c) patterning the coated material into a sacrificial layer including a top sacrificial layer covering a desired portion of the integrated circuit unit and a side portion filling the grooves, (d) cutting the wafer through the grooves to a wafer mount tape of the wafer into individual dice, each die including a corresponding integrated circuit unit, the side portion being divided into respective side sacrificial layers for adjacent dice, (e) stretching the wafer mount tape so as to create gaps between the adjacent dice, (f) coating a polymer material over the diced wafer, the polymer material filling the gaps between the dice, (g) patterning the polymer material into a structural layer including a top structural layer and a side structural layer, the top structural layer covering the sacrificial layer on each die, the side structural layer filling the gaps, (h) cutting through the side structural layer in the gap such that the side structural layer is divided into respective side walls for the adjacent dice, (i) attaching the dice on a carrier and providing electrical connections, (j) molding the wire-bonded die with an encapsulant material, and (k) heating the encapsulant material, wherein the sacrificial layer decomposes and outgasses, thereby leaving a top air cavity under the top structural layer and a side air cavity between the die and the side wall.

BRIEF DESCRIPTION OF THE DRAWINGS

The invention, together with further objects and advantages thereof, may best be understood by reference to the following description taken in conjunction with the accompanying drawings in which.

It is to be understood that, in the drawings, like reference numerals designate like structural elements. Also, it is understood that the depictions in the figures are diagrammatic and not to scale.

DETAILED DESCRIPTION OF THE EMBODIMENTS

The present invention relates generally to relieving stress on sensitive areas of a semiconductor die in an integrated circuit package.

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessary obscuring of the present invention.

As mentioned above, molding-induced stresses in plastic packages are due in large part to cure shrinkage of the mold compound and thermal mismatch between the various components in the package. Such stresses may cause reliability problems ranging from parametric shift, to hysteresis change, and to passivation and dielectric cracking. For high precision analog devices, for example, control and minimization of such stresses are important factors to achieve good device performance.

Figure 1:
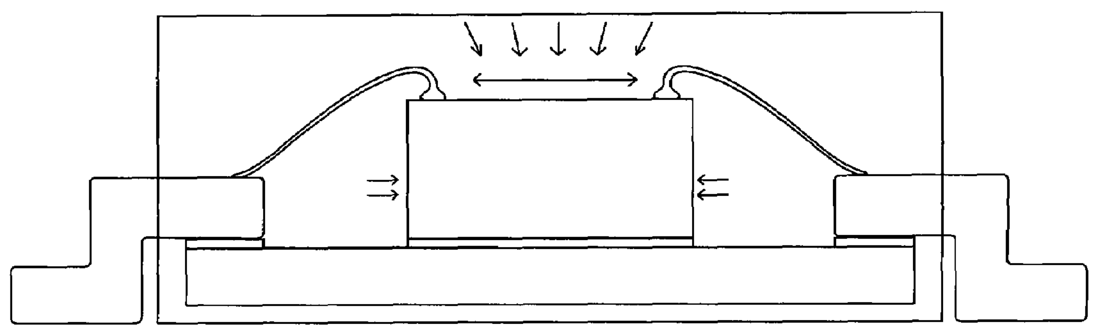
FIG. 1 is a diagram illustrating a schematic cross sectional side view of a conventional semiconductor package affected by molding-induced stresses.
Figure 2:
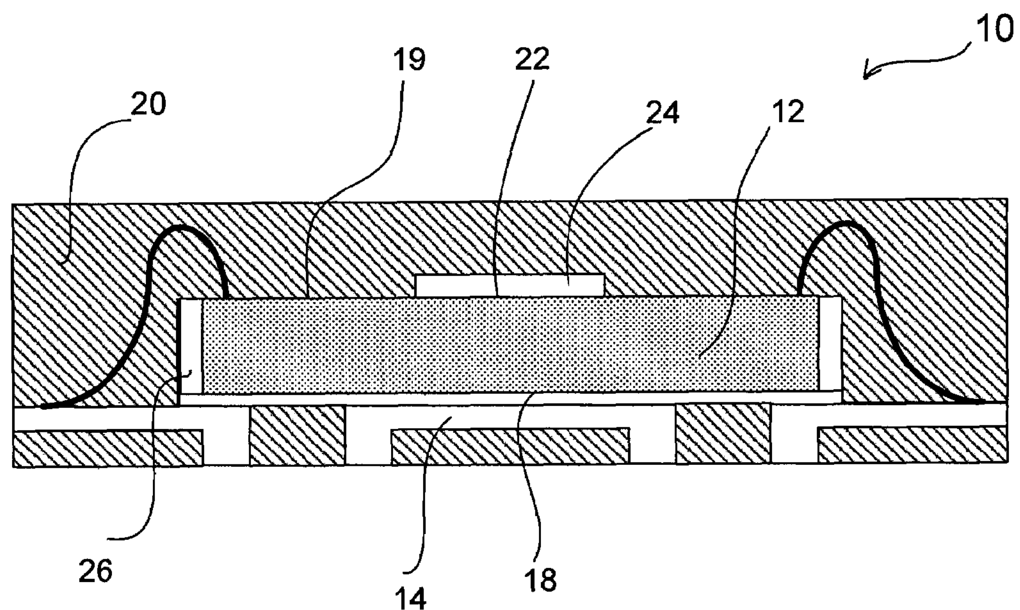
FIG. 2 is a diagram illustrating a schematic cross sectional side view of an integrated circuit package having air cavities in accordance with one embodiment of the present invention.

In accordance with embodiments of the present invention, the molding-induced stresses are reduced or minimized by creating an air cavity around the silicon device inside the plastic package. FIG. 2 schematically illustrates an integrated circuit (semiconductor) package 10 in accordance with one embodiment of the present invention. As shown in FIG. 2, the integrated circuit package 10 includes an integrated circuit die 12 attached to a carrier 14 with its bottom surface 18, and a molding compound 20 surrounding the integrated circuit die 12. The carrier 14 may be a die attach pad of a lead frame as shown in FIG. 2, or other substrate such as a ball grid array (BGA) or landed grid array (LGA). The integrated circuit package may be mounted on a printed circuit board (PCB). The die 12 is typically provided with electrical connections, for example, by wire-bonding to the lead frame. The top surface 19 of the integrated circuit die 12 includes at least one stress sensitive area 22, such as an active area. As shown in FIG. 2, the molding compound 20 includes a top air cavity 24 formed over at least one stress sensitive area 22. The top air cavity 24 reduces in-plane and direct compressive stresses on the top surface.

However, the top air cavity 24 does not affect the compressive stresses acting on the die sides. Accordingly, the molding compound 18 may also include a side air cavity 26 formed on the side surfaces of the integrated circuit die 12. The side air cavity 26 surrounds the die sides. The top air cavity 24 and the side air cavity 26 isolate the effect of shrinkage of the molding compound during post-mold cure, and thus reduce both top die stresses and the side compression.

Figure 3:
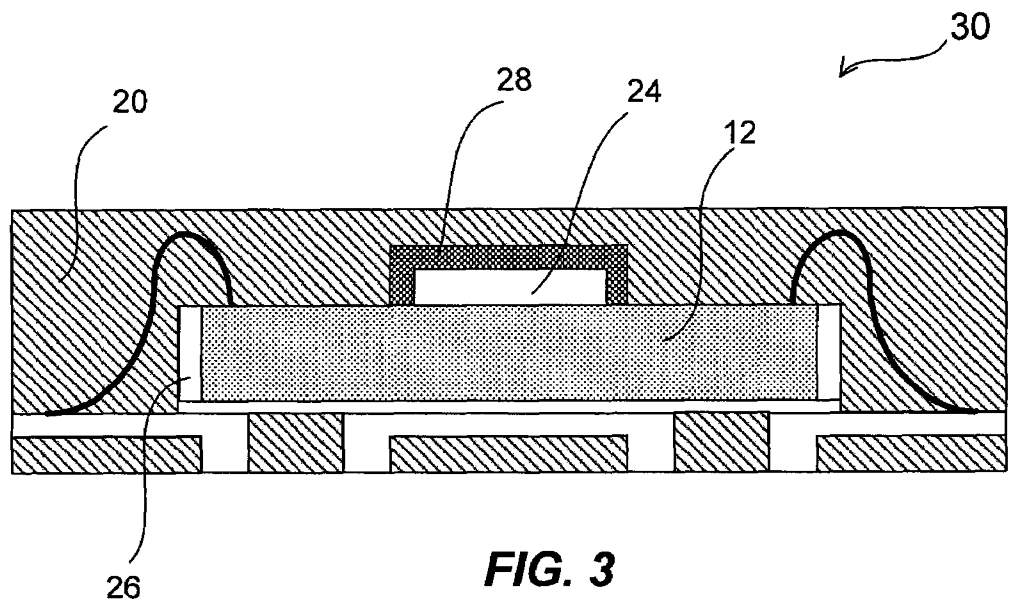
FIG. 3 is a diagram illustrating a schematic cross sectional side view of an integrated circuit package having air cavities and a structural layer in accordance with one embodiment of the present invention.

FIG. 3 schematically illustrates an integrated circuit package 30 in accordance with another embodiment of the present invention, which further includes a top structural layer 28 formed in the molding compound 20. The top structural layer 28 surrounds the top air cavity 24. The top structural layer 28 is preferably made of a polymer, and may have small via holes (vent) or pores.

Figure 4:
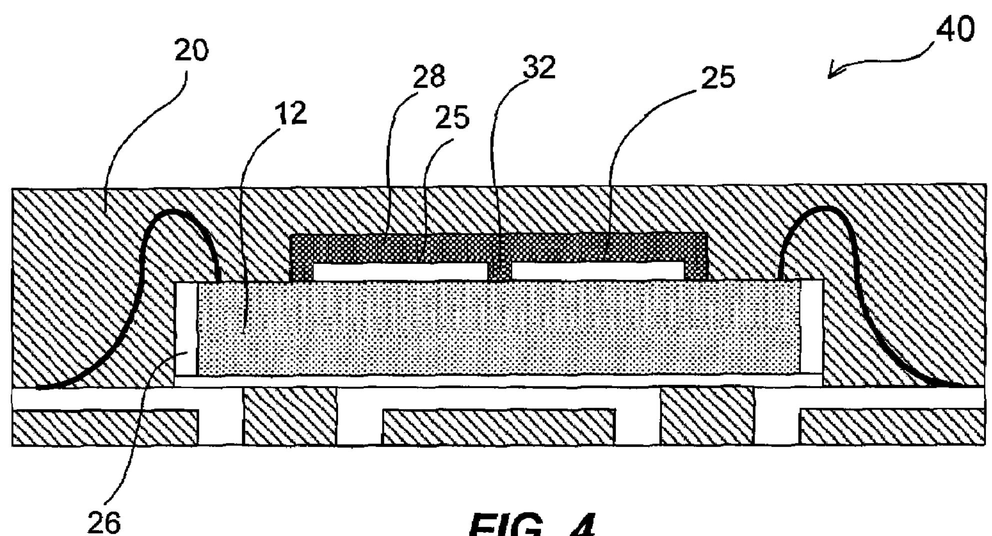
FIG. 4 is a diagram illustrating a schematic cross sectional side view of an integrated circuit package having air cavities and a structural layer in accordance with another embodiment of the present invention.

FIG. 4 schematically illustrates an integrated circuit package 40 in accordance with one embodiment of the present invention, which further includes one or more supporting columns 32. For a larger air cavity 25 for a larger die, or larger sensitive area, such a supporting column 32 prevents collapse of the molding material into the cavity during a post mold cure process. The supporting columns 32 are preferably made of the top structural layer 28.

Figure 5:
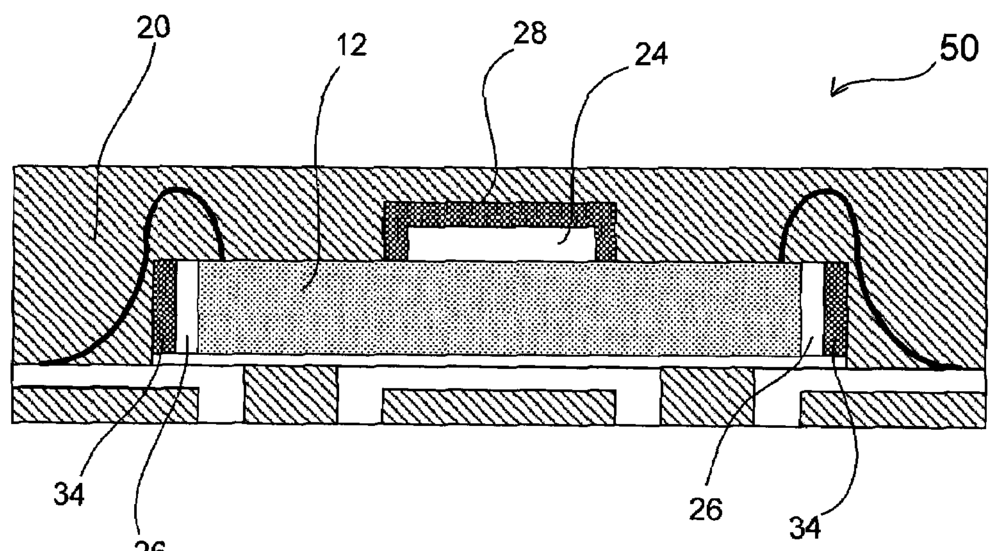
FIG. 5 is a diagram illustrating a schematic cross sectional side view of an integrated circuit package having air cavities and structural layers in accordance with one embodiment of the present invention.

FIG. 5 schematically illustrates an integrated circuit package 50 in accordance with yet another embodiment of the present invention, which further includes a side wall 34 formed on the side surfaces of the die 12. The side wall 34 surrounds the side air cavity 26, and is preferably made of the same material as the top structural layer 28. The side wall 34 also prevents the molding material from collapsing into the side air cavity 26.

Figure 6:
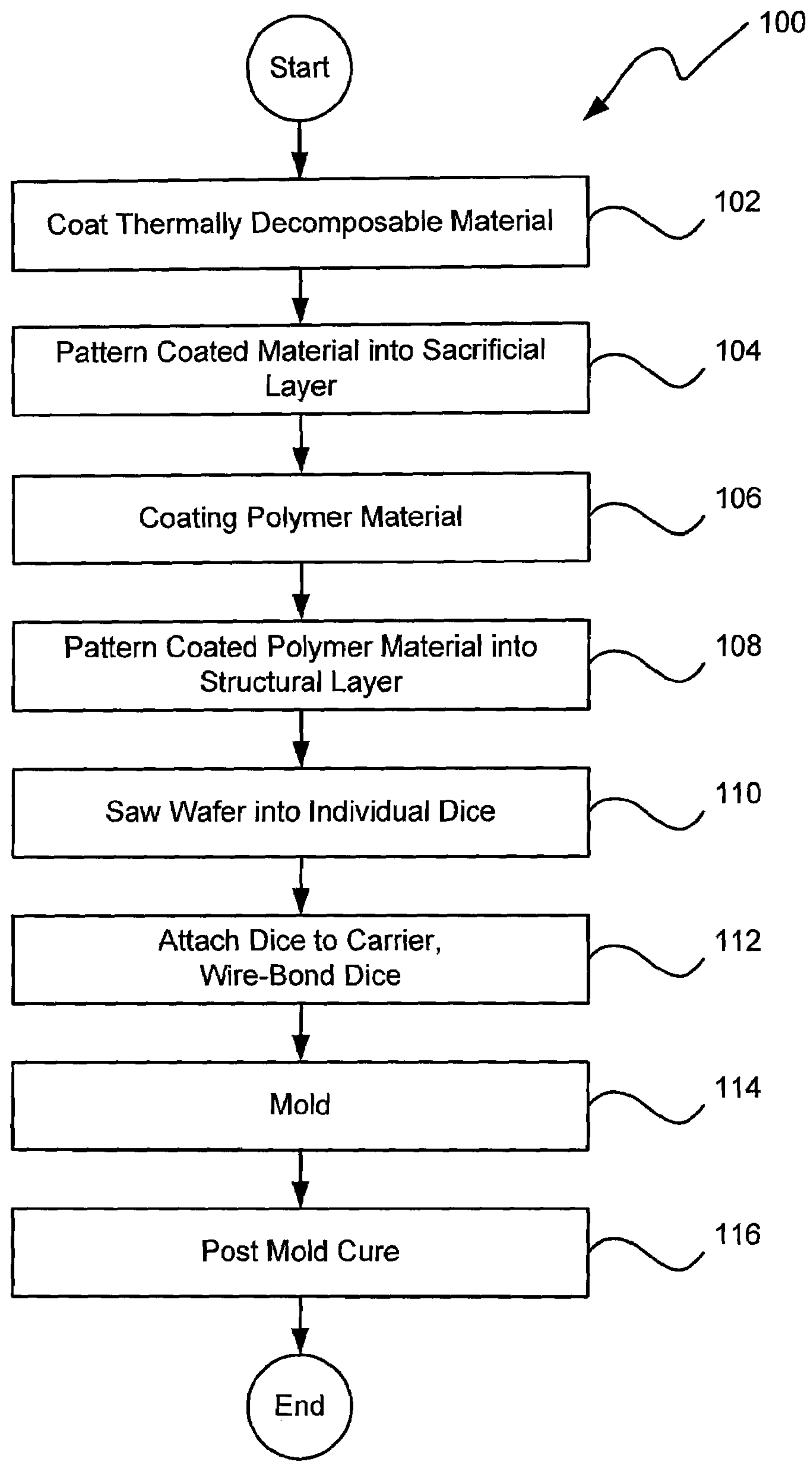
FIG. 6 is a process flow diagram illustrating a method for creating an air cavity in a molding compound for an integrated circuit die, in accordance with one embodiment of the present invention.
Figure 7:
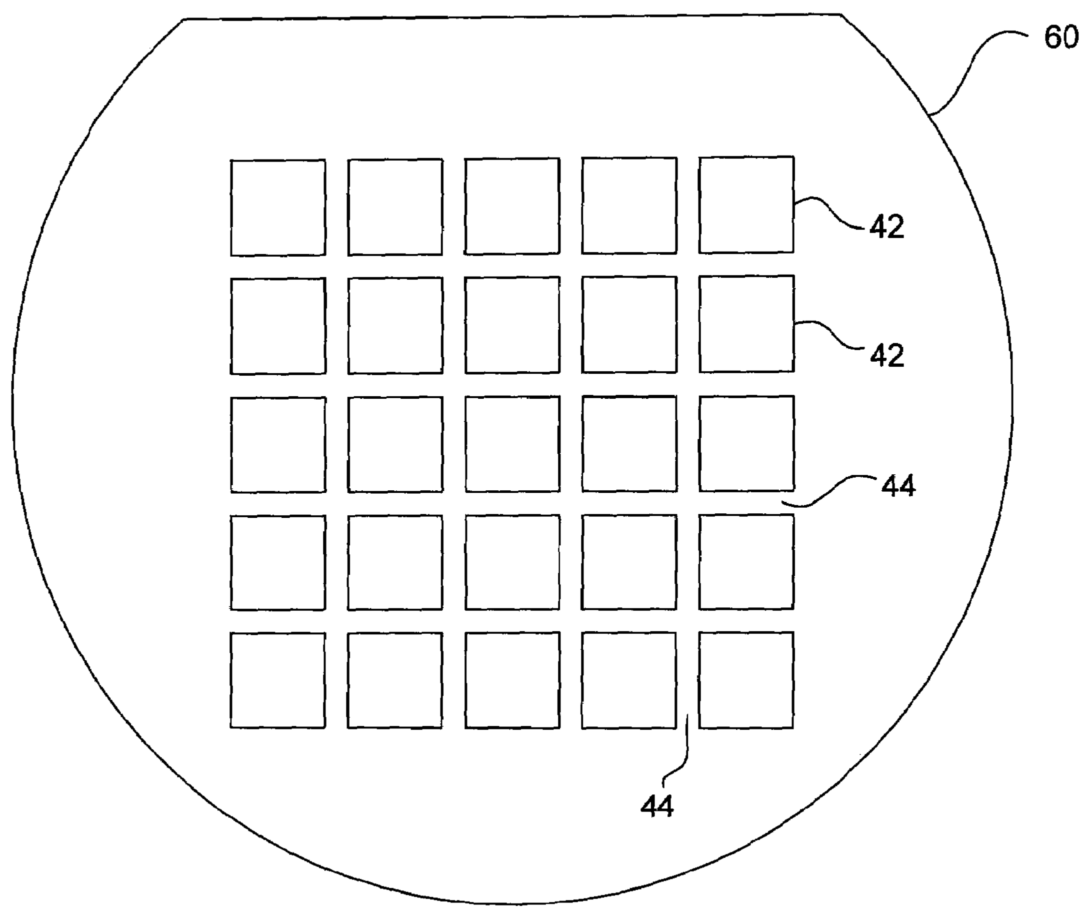
FIG. 7 is a diagram schematically illustrating an example of fabricated wafer having integrated circuit units thereon.

FIG. 6 schematically illustrates a process flow 100 of a method for creating an air cavity in a molding compound for an integrated circuit die, in accordance with one embodiment of the present invention. FIG. 7 schematically illustrates an example of a silicon wafer 60 on which integrated circuit units 42 are formed. An integrated circuit unit 42 is a small block of semiconducting material on which functional circuits are fabricated (functional area). Typically, the integrated circuit units 42 are arranged in the form of a matrix. Narrow non-functional spaces 44 between the functional units 42 are referred to as scribe lines, along which the wafer 60 is cut into individual pieces (dice).

Figure 8A:
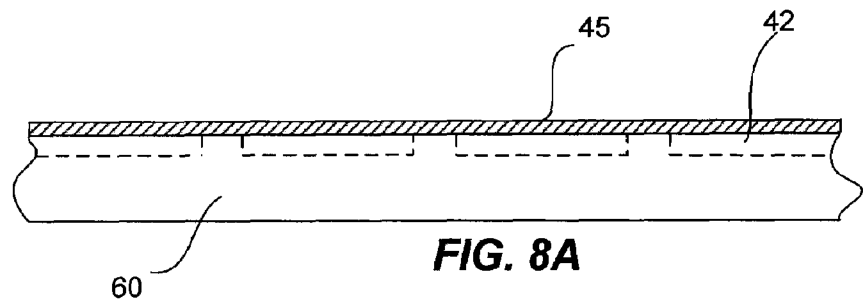
FIGS. 8A-8D are diagrams illustrating a schematic cross sectional side view of a wafer with integrated circuit units during the process of creating an air cavity in a molding compound of an integrated circuit package, in accordance with one embodiment of the present invention.

Returning to FIG. 6, after wafer fabrication, a thermally decomposable material 45 is coated on a wafer including a plurality of integrated circuit units (102), using, for example, spin coating with a thickness of about 2-4 mils (1 mil=25 μm). The thermally decomposable material is preferably a photo-sensitive material, and thus can be patterned using a photo-mask and exposure and developing (etch back) processes. For example, a photo-sensitive sacrificial material such as Unity™ Sacrificial Material 2000P, available from Promerus LLC, Brecksville, Ohio, may be used as the thermally decomposable material. FIG. 8A schematically illustrates a cross sectional view of the wafer 60 on which the thermally decomposable material 45 is coated.

Figure 8B:
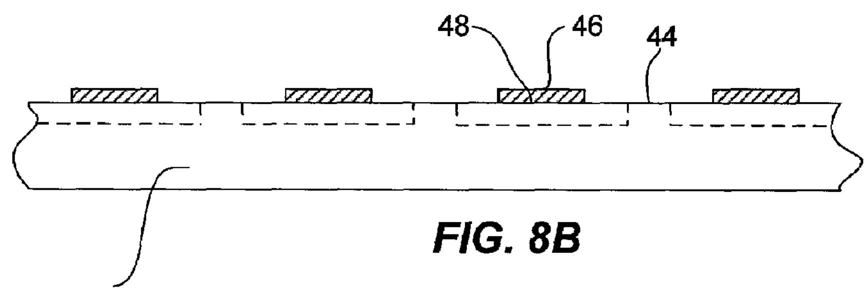

Returning to FIG. 6, after being coated on the wafer, the thermally decomposable material is patterned into a sacrificial layer 46 (104), as shown in FIG. 8B. The sacrificial layer 46 covers a desired portion 48 of each integrated circuit unit 42. The desired portion 48 may be a stress sensitive area of the active surface of the integrated circuit unit 42. It should be noted that in order to provide one or more supporting column in the top air cavity, the sacrificial layer may have two or more separate areas on the integrated circuit unit 42, as shown in FIG. 4.

Figure 8C:
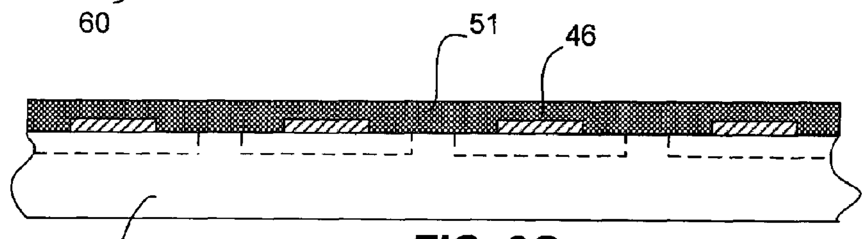
Figure 8D:
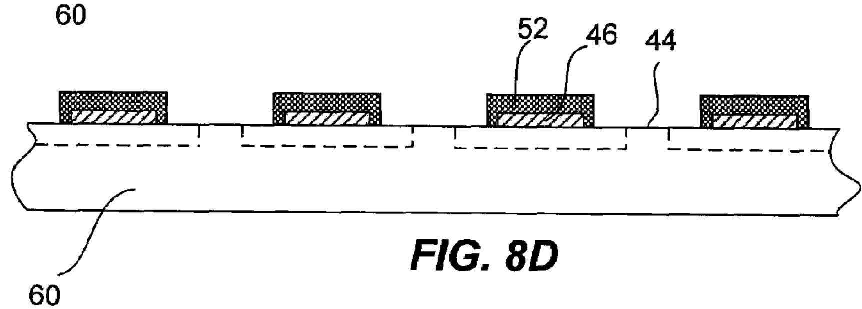

Returning to FIG. 6, a polymer material is then coated on the wafer over the sacrificial layer 46 (106), as shown in FIG. 8C, using, for example, spin coating. The coated polymer material 51 is then patterned into a structural layer 52 covering the sacrificial layer 46 (108), as shown in FIG. 8D. For example, a low stress structural material such as Avatrel® series, for example, Avatrel® EPM, Avatrel®2580P, Avatrel®2585P, Avatrel®2095P, Avatrel®2195P, or Avatrel®7584P, available from Promerus LLC, Brecksville, Ohio, may be used as the polymer material. Those materials are photo definable, photo imaginable, or laser definable, and are patterned using exposure and developing (etch back) processes. The structural layer 52 may have a thickness of about 5-10 mils.

Figure 9A:
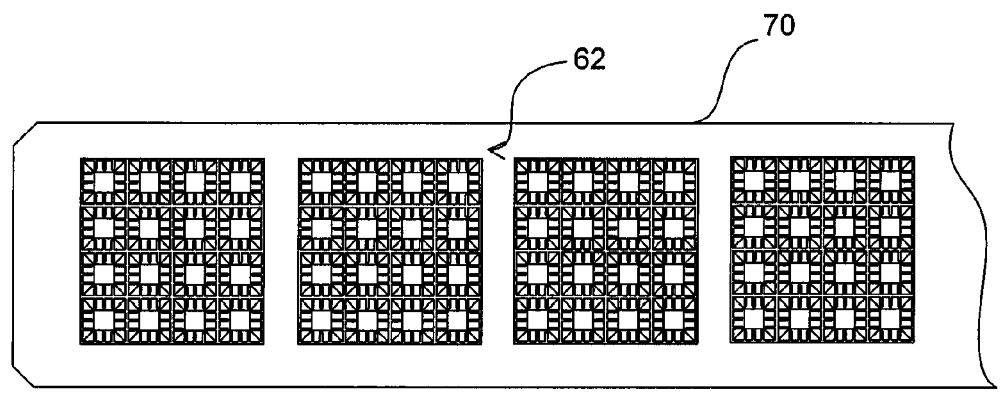
FIGS. 9A-9C are diagrams illustrating schematic top plan views of a leadframe and device areas formed thereon.
Figure 9B:
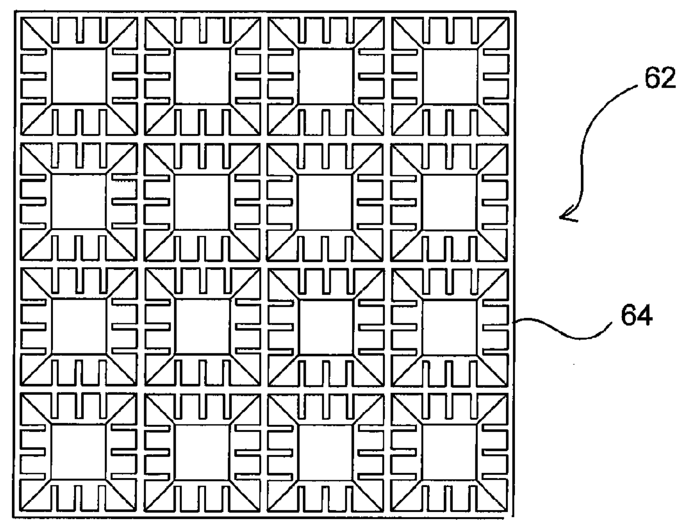
Figure 9C:
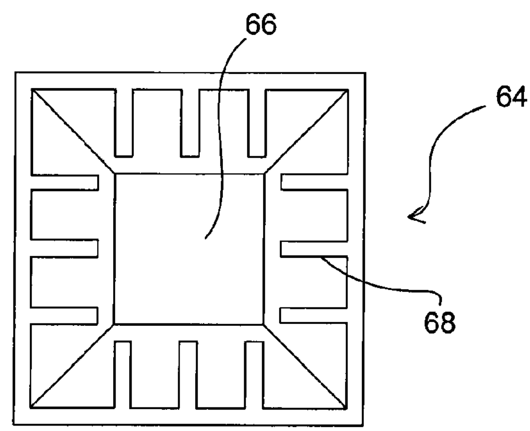

Returning to FIG. 6, thus fabricated wafer 60 with sacrificial layer 46 and the structural layer 52 thereon are sawn into individual dice through the nonfunctional areas (scribe lines) 44 (110). The wafer 60 may be mounted on a plastic tape (wafer mount tape) before dicing. Then the individual dice are attached to a carrier such as die attach pads of a lead frame or other organic or inorganic (e.g., ceramic) substrate for array packages such as a ball grid array (BGA), a land grid array (LGA), and the like, using any conventional die attachment technique (112). The dice are also provided with electrical connection (such as wire bonding) in accordance with the die configuration (112). For example, a leadframe panel (or strip) may be used for such die attach and electrical connection processes, and subsequent packaging. FIG. 9A schematically illustrates an example of a leadframe panel 70. The leadframe panel 70 is typically a thin sheet or sheets of conductive substrate material which define a plurality of arrays or matrices 62 of individual device areas etched or stamped into the substrate. FIG. 9B schematically illustrates such a matrix 62 and device areas 64. Each device area 64 further defines a die attach pad 66 and a number of leads 68, as shown in FIG. 9C.

Referring back to FIG. 6, thus fabricated dice on the carrier are molded (encapsulated) (114). One or more encapsulating caps may be formed over the leadframe panel 70 using any conventional molding process such as pressure transfer molding or injection molding. For example, the carrier with the dice thereon may be enclosed in a suitable mold and an encapsulant material is injected into the mold cavity. For example, a plastic molding material or an epoxy based resin such as epoxy molding compound (EMC) can be used.

Figure 8E:
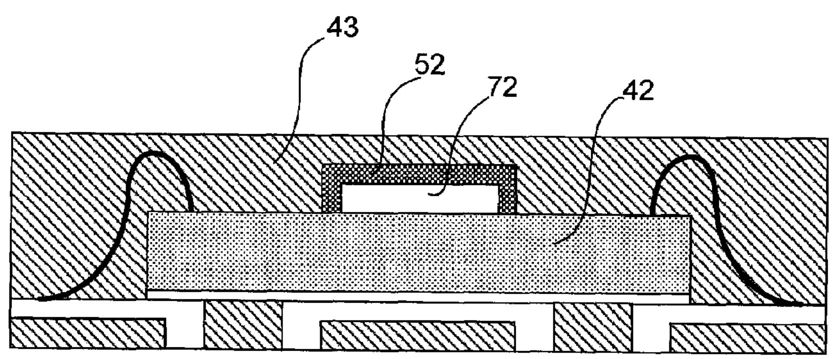
FIG. 8E is a diagram illustrating a schematic cross sectional side view of an integrated circuit package in accordance with one embodiment of the present invention.

When a thermo-setting plastic is used as the molding material, the molding material is heated to cure and form the final mold compound (post-mold cure) (116). In the heating process, the sacrificial layer 46 decomposes and outgasses through the structural layer 52 and the encapsulant 43 so as to leave an air cavity 72, as shown in FIG. 8E. For example, the sacrificial layer 46 may decomposes and outgases at 150-170° C., while the post mold cure is done at 175° C. Of course, when different sacrificial materials are used, the outgass temperature may also be different. In addition, a thermoplastic material may be used as the molding material. By way of example, the top air cavity 72 may provide a gap of about 2-4 mils under the structural layer 52 of a thickness of about 5-10 mils. The gap (cavity) has a high width-to-height ratio, for example, more than 100, so as to cover selected areas of the die or the whole die to relieve the stress. The structural layer prevents the encapsulant material from collapsing or sagging into the cavity during the post-mold cure process. The suitable thickness of the structural layer is selected depending on the thickness of the encapsulant, the height and footprint of the air cavity, and the like. After encapsulation, the dice on leadframe goes through ordinary fabrication processes.

Figure 10A:
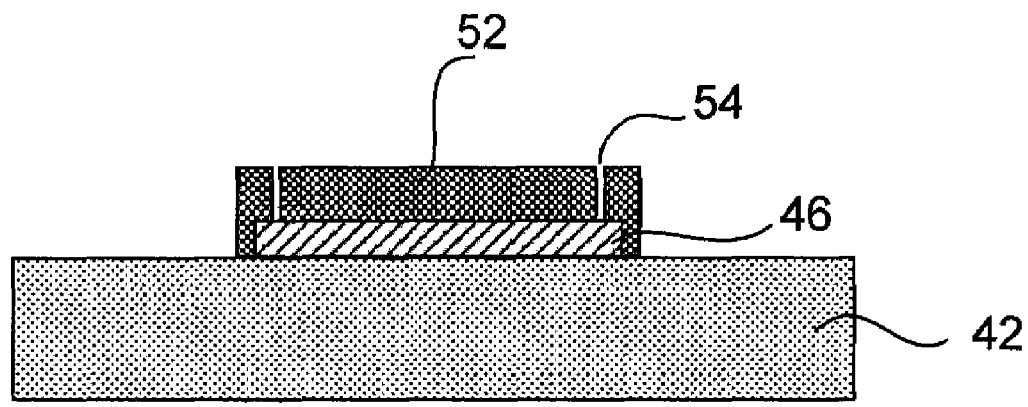
FIGS. 10A and 10B are diagrams illustrating schematic cross sectional side view and a top plan view, respectively, of a structural layer having via holes in accordance with another embodiment of the present invention.
Figure 10B:
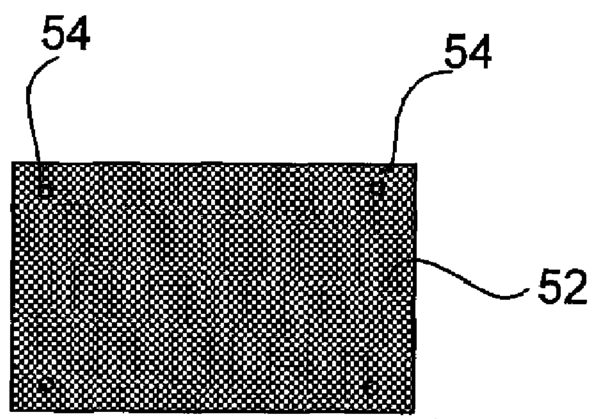

In accordance with one embodiment of the present invention, the structural layer 52 is gas permeable to facilitate the outgassing of the sacrificial layer 46 during the post mold cure process. A gas permeable polymer material may be selected, or the structural layer may be provided with via holes (vent). In the latter case, via holes may be formed at the same time as the structural layer 52 is patterned. FIG. 10A schematically illustrates a die 42 with a top structural layer 52 having such via holes 54. FIG. 10B schematically illustrates a plan view of the top structural layer 52 with via holes 54. The number and location of the via holes may be selected depending on the gas permeability of the structural layer 52. The size of the via holes should be small enough to prevent the encapsulant material from getting therein during coating or dripping into the air cavity during the molding process.

Figure 11:
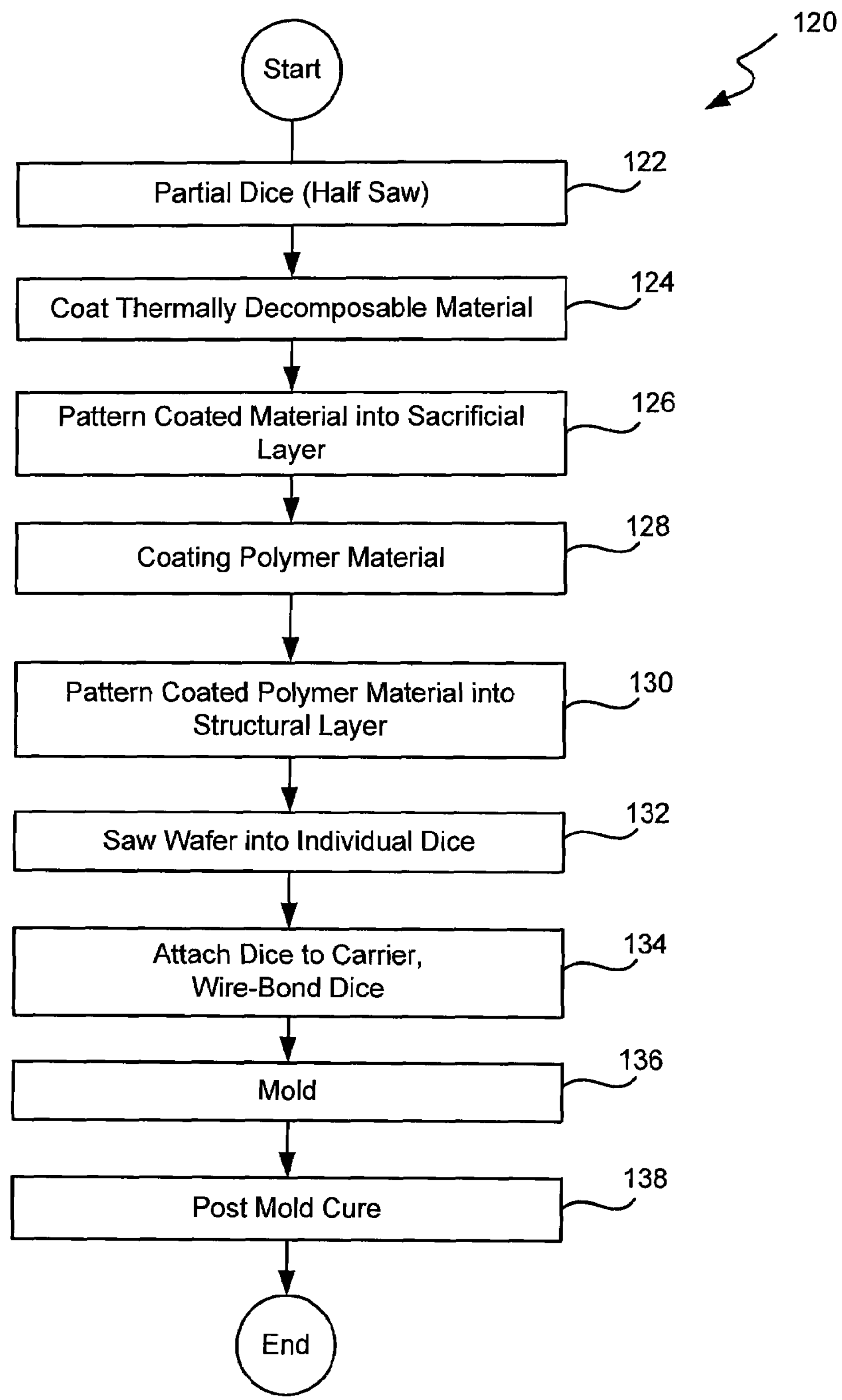
FIG. 11 is a process flow diagram illustrating a method for creating an air cavity in a molding compound for an integrated circuit die, in accordance with one embodiment of the present invention.
Figure 12A:
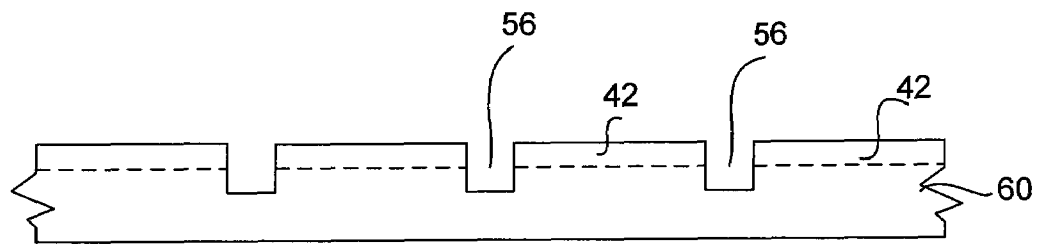
FIGS. 12A through 12G are diagrams illustrating a schematic cross sectional side view of an integrated circuit die during the process of creating an air cavity in a molding compound of an integrated circuit package in accordance with one embodiment of the present invention.
Figure 12B:
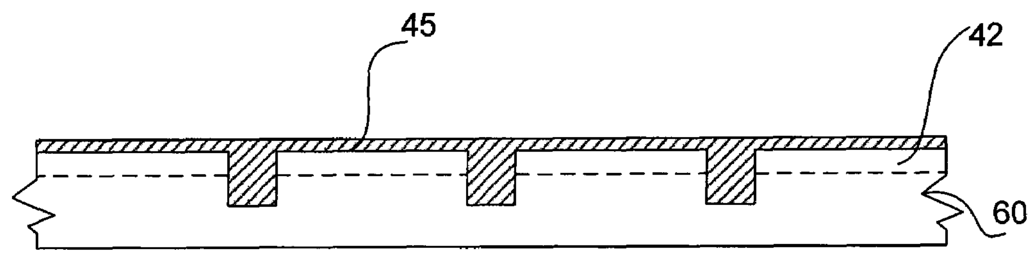
Figure 12C:
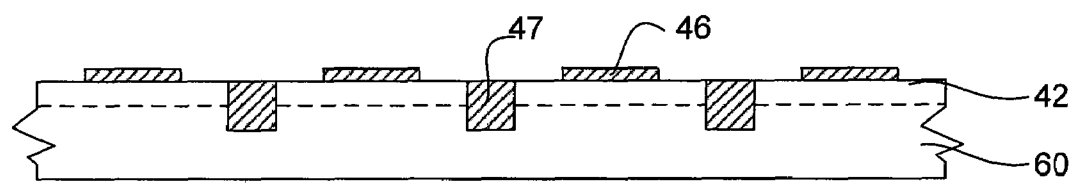
Figure 12D:
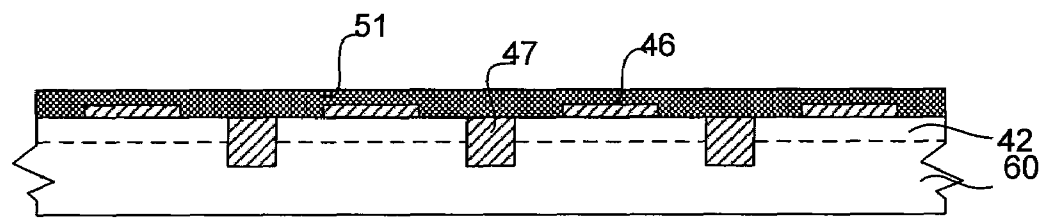
Figure 12E:
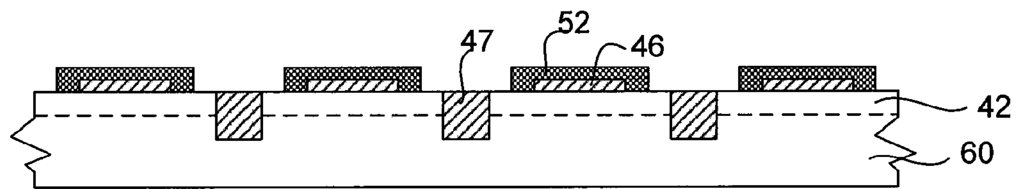
Figure 12F:
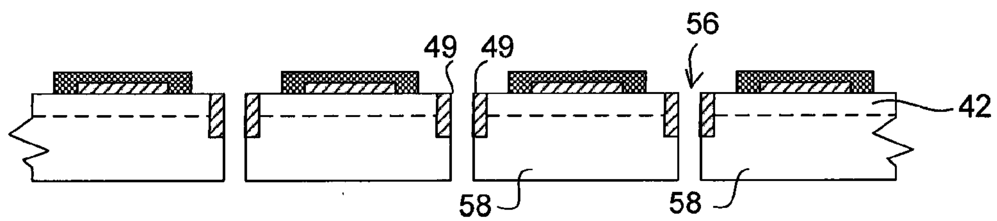

FIG. 11 schematically illustrates a process flow 120 in which a side air gap is also provided around the side surface of the die in order to reduce stresses on the die sides, in accordance with one embodiment of the present invention. As shown in FIG. 12A, before the thermally decomposable material 45 is coated, the wafer 60 is partially diced or half sawn to form grooves 56 between adjacent integrated circuit units (die) 42 (122). The grooves 56 are formed in the non functional areas, i.e., along scribe lines. The subsequent steps 124 through 138 described below are the substantially the same as steps 102 through 116 in FIG. 6, except the following additional features. When the thermally decomposable material 45 is coated on the wafer 60 over the integrated circuit units 42 (124), the thermally decomposable material 45 also fills the grooves 56 as shown in FIG. 12B. Thus, after patterning of the coated material (126), the sacrificial layer includes a top sacrificial layer 46 covering the desired portion of the integrated circuit device 42 and a side portion 47 filling the grooves 56, as shown in FIG. 12C. A polymer material 51 is coated on the wafer 60 as shown in FIG. 12D (128), and is patterned into a structural layer 52 as shown in FIG. 12E (130). The wafer 60 is then cut through the grooves 56 to singulate the dice. The second cut extends to the bottom of the wafer such that each of the individual dice 58 has part of the side portion 47 in the groove 56 as a side sacrificial layer 49, as shown in FIG. 12F (132). The second saw (132) uses a cutting blade thinner than that is used in the first cut to form the grooves 56 (122), such that the remaining side portions 47 form the side sacrificial layers 49 for adjacent dice 58. The wafer may be placed on a wafer mount tape (not shown) before the second cut or the first cut.

Figure 12G:
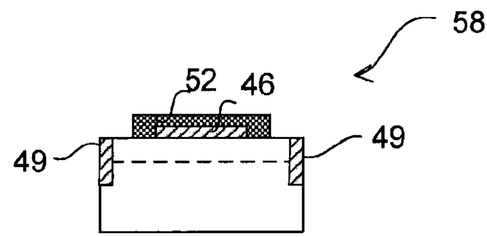
Figure 12H:
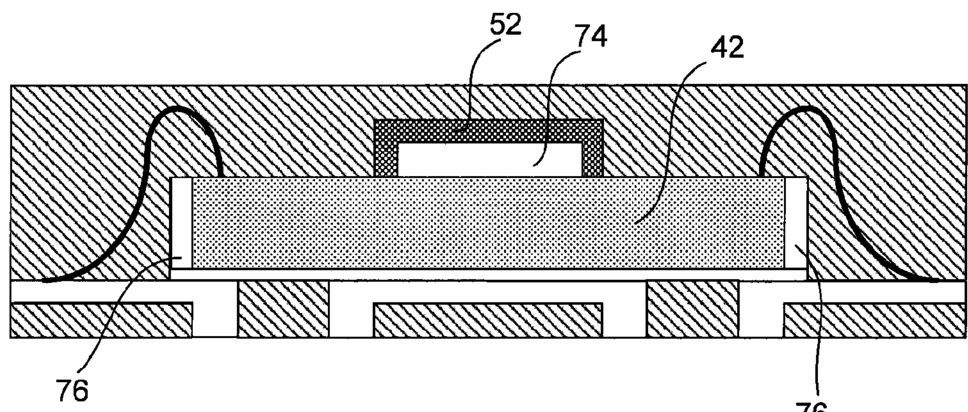
FIG. 12H is a diagram illustrating a schematic cross sectional side view of an integrated circuit package in accordance with one embodiment of the present invention.

FIG. 12G schematically illustrates an isolated die 58 having the top and side sacrificial layers 46 and 49 and a structural layer 52 covering the top sacrificial layer 46. The individual dice 58 are placed on a carrier such as a leadframe or other substrate and provided with electric contacts such as wire bonding (134) and molded with encapsulant material (136) in a similar manner as previous embodiments described above. In the post mold cure process (138), the top and side sacrificial layers 46 and 49 decompose and outgass, leaving the air cavity which includes a top air cavity 74 under the top structural layer 52 and a side air cavity 76 on the die side, as shown in FIG. 12H.

Figure 13:
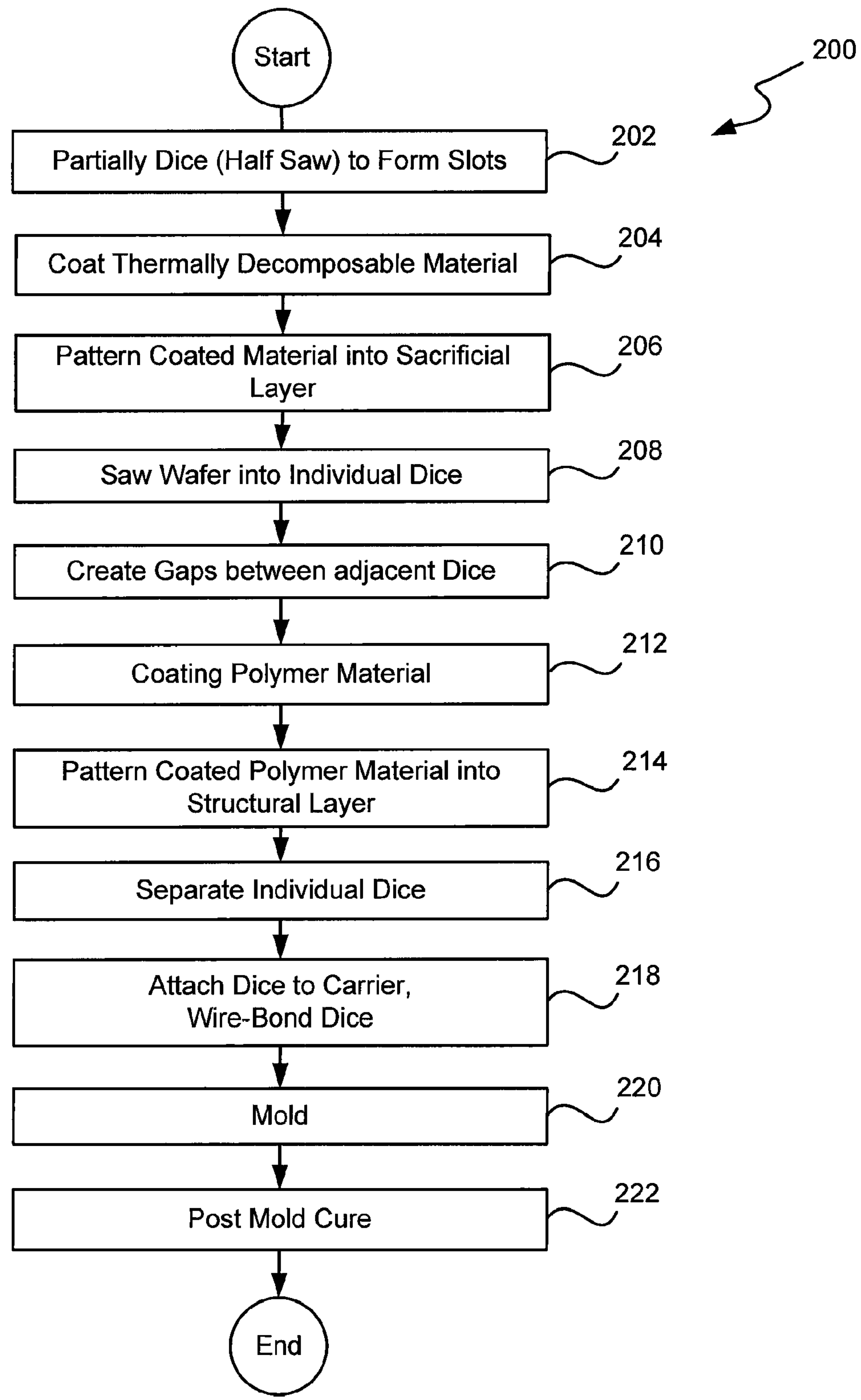
FIG. 13 is a process flow diagram illustrating a method for creating an air cavity in a molding compound for an integrated circuit die, in accordance with one embodiment of the present invention.
Figure 14A:
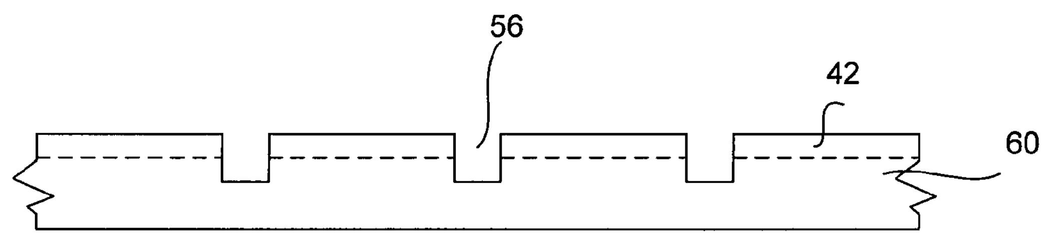
FIGS. 14A through 14I are diagrams illustrating a schematic cross sectional side view of an integrated circuit die during the process of creating an air cavity in a molding compound of an integrated circuit package in accordance with one embodiment of the present invention.
Figure 14B:
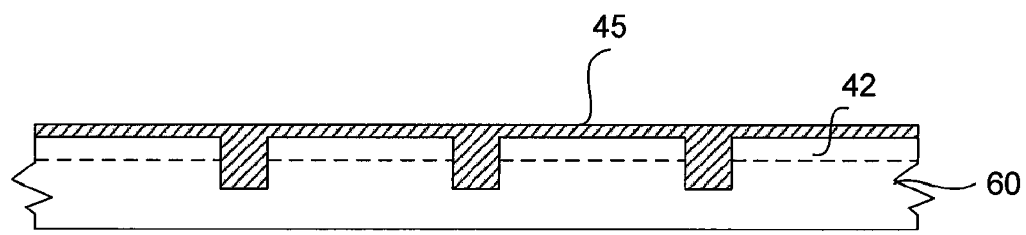
Figure 14C:
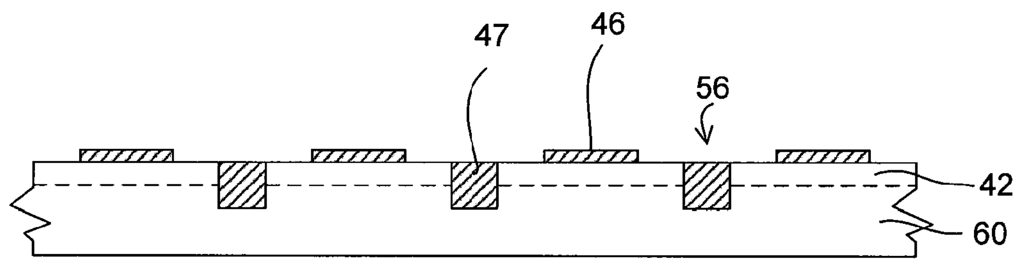

FIG. 13 schematically illustrates a process flow 200 of a method for creating an air cavity in a molding compound for an integrated circuit die, in accordance with one embodiment of the present invention. After wafer fabrication, a plurality of integrated circuit units (functional area) 42 are formed on a top surface of a wafer 60, as shown in FIG. 7 as discussed above. The wafer 60 is partially diced (half sawn) to form grooves 56 between adjacent integrated circuit units 42 (202), as shown in FIG. 14A. A thermally decomposable material 45 is coated on the wafer 60, using spin coat, for example, such that the thermally decomposable material 45 fills the grooves 56 (204) as shown in FIG. 14B. The thickness of the coated material 45 may be about 2-4 mils. The thermally decomposable material 45 is preferably photosensitive material, and thus can be patterned using photolithography processes. For example, a photo-sensitive sacrificial material such as Unity™ Sacrificial Material 2000P, available from Promerus LLC, Brecksville, Ohio, may be used as the thermally decomposable material. The coated material 45 is then patterned into a sacrificial layer (206). The sacrificial layer includes a top sacrificial layer 46 covering a desired portion of the integrated circuit unit 42 and a side portion 47 filling the grooves 56, as shown in FIG. 14C. The above steps 202 through 206 are substantially the same as steps 122 through 126 in FIG. 11 described above.

Figure 14D:
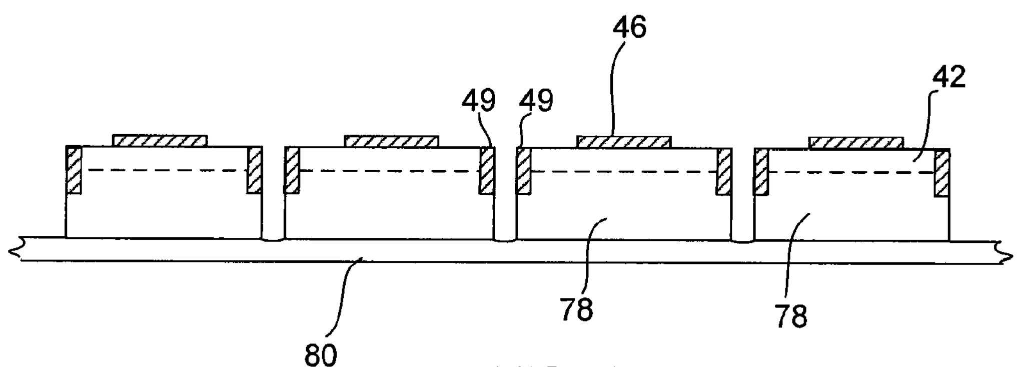

The wafer 60 is then sawn through the grooves 56 into individual dice 78 (208) such that each die 78 includes a corresponding integrated circuit unit 42, as shown in FIG. 14D. The side portion 47 is divided into respective side sacrificial layers 49 for adjacent dice 78. The second cut extends to a wafer mount tape 80 of the wafer 60. The second saw (208) uses a blade thinner than that is used in the first cut to form the grooves 56 (202), such that the remaining side portions 47 form the side sacrificial layers 49 for adjacent dice 58.

Figure 14E:
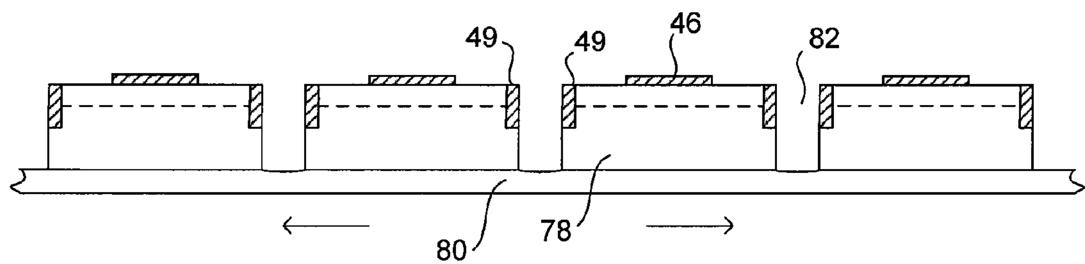

The wafer 60 may be mounted on the wafer mount tape 80 before the initial half saw (202), or just before this second saw (208). The wafer mount tape 80 is typically plastic and flexible/stretchable. Then, the wafer mount tape 80 is stretched so as to create gaps 82 between the adjacent dice 78 (210), as shown in FIG. 14E. It should be noted that the wafer mount tape 80 is stretched in two-dimensional manner or in the radial direction such that the gaps 82 surround the corresponding dice 78.

Figure 14F:
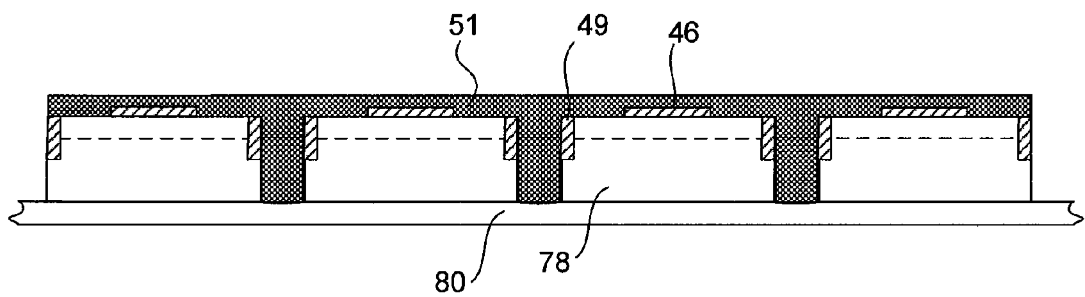

A polymer material 51 is then coated over the diced wafer (i.e., a matrix of dice 78 on the wafer mount tape 80) such that the polymer material 51 fills the gaps 82 between the dice 78 (212), as shown in FIG. 14F. The polymer material 51 may have a thickness of about 5-10 mils. For example, a low stress structural material such as Avatrel® series, such as Avatrel® EPM, Avatrel®2580P, Avatrel®2585P, Avatrel®2095P, Avatrel®2195P, or Avatrel®7584P, available from Promerus LLC, Brecksville, Ohio, may be used as the polymer material. Those materials are photo definable, photo imaginable, or laser definable, and are patterned using exposure and developing (etch back) processes.

Figure 14G:
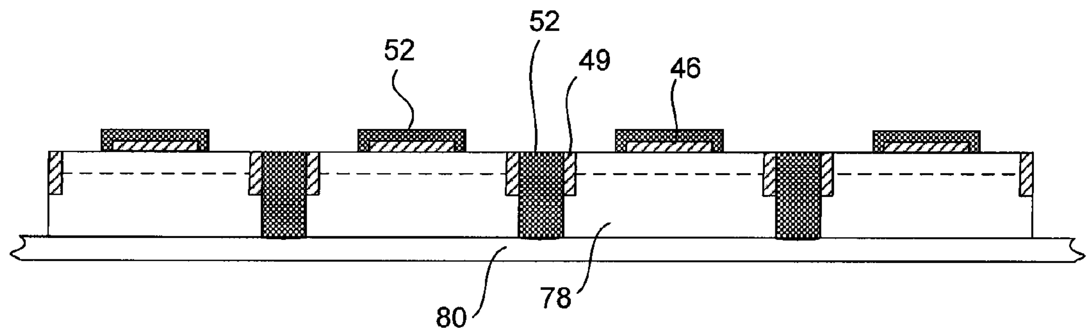

The coated polymer material 51 is then patterned into a structural layer (214). As shown in FIG. 14G, the structural layer includes a top structural layer 52 and a side structural layer 53, where the top structural layer 52 covers the sacrificial layer on each die 78, and the side structural layer 53 fills the gaps 82. The structural layer 52 may have a thickness of about 5-10 mils. The top structural layer 52 may be provided with via holes (vent) as described above (FIGS. 10A and 10B).

Figure 14H:
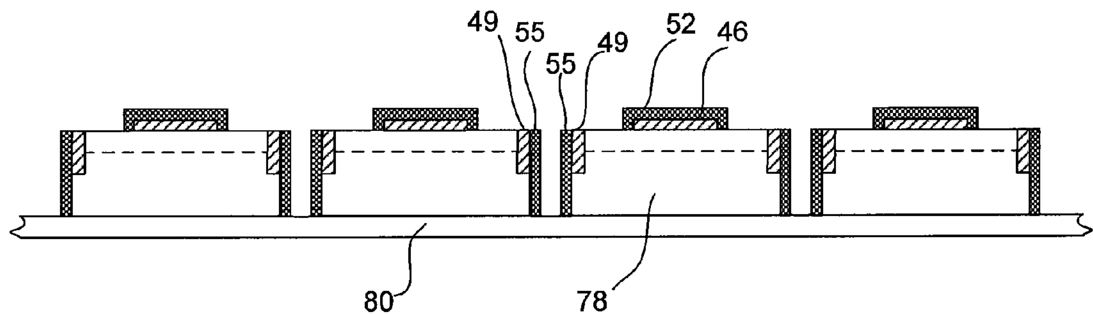
Figure 14I:
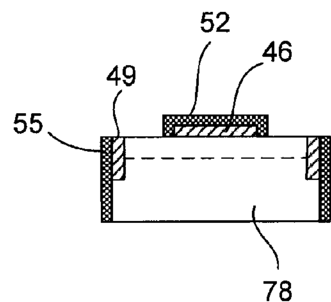

The wafer 60 (i.e., the matrix of dice 78) is sawn through the side structural layer 53 in the gap 82 to the wafer mount tape 80 such that the side structural layer 53 is divided into respective side walls 55 for the adjacent dice 78 (216), as shown in FIG. 14H. FIG. 14I schematically illustrates a piece of the resulting die 78 including the top structural layer 55 covering the top sacrificial layer 46 and the side wall 55 covering the side sacrificial layer 49.

Figure 14J:
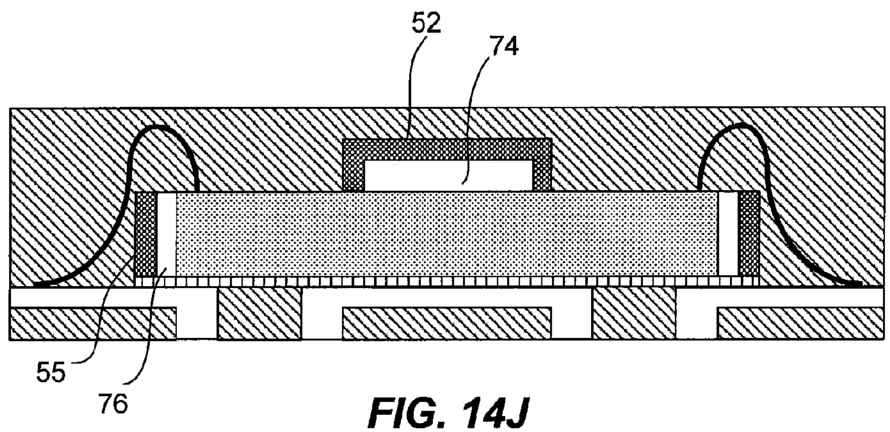
FIG. 14J is a diagram illustrating a schematic cross sectional side view of an integrated circuit package in accordance with one embodiment of the present invention.

The dice 78 are attached on a carrier and wire-bonded (218) or otherwise provided with electrical connections, and molded using an encapsulant material (220) in a similar manner as described above. In a post mold cure process (222), the top and side sacrificial layers 46 and 49 decompose and outgass, in a similar manner as described above, leaving a top air cavity 74 under the top structural layer 52 and a side air cavity 76 between the die 78 and the side wall 55, as shown in FIG. 14J.

Although only a few embodiments of the invention have been described in detail, it should be appreciated that the invention may be implemented in many other forms without departing from the spirit or scope of the invention. It should be appreciated that the described arrangement can be used in virtually any packaging style. The size, shape and height or width of the air cavity may be arranged to accommodate the needs of any particular situation and characteristics of the materials used, such as viscosity and its temperature dependence.

The invention has been primarily designed in the context of leadframe-based packages. However, it should be appreciated that similar technologies can be applied to organic and inorganic (e.g., ceramic) substrates to form microarray packages. However, it should be appreciated that similar technologies can be used to form air cavities in underfill layers used in flip-chip type packages, or in conjunction with other package protection arrangements such as glob-toppings, and the like.

If the die has more than one sensitive area, then it may be desirable to provide multiple air cavities to cover the different sensitive areas or air cavities having larger footprints that cover multiple sensitive areas. The molding process may be formed in panel form, as described above, or on individual devices.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method for creating an air cavity in a molding compound for an integrated circuit die, said method comprising:

coating a thermally decomposable material on a wafer including a plurality of integrated circuit units;

patterning the coated material into a sacrificial layer such that the sacrificial layer covers a desired portion of each integrated circuit unit;

coating a polymer material on the wafer over the sacrificial layer;

patterning the polymer material into a structural layer covering the sacrificial layer;

sawing the wafer into individual dice, each die including a corresponding integrated circuit unit;

attaching dice to a carrier (die attach pads etc.) and provide electrical connections;

covering the dice on the carrier with an encapsulant material; and heating the encapsulant material, wherein the sacrificial layer decomposes and outgasses through the structural layer and the encapsulant material, thereby leaving an air cavity.

2. The method of claim 1, wherein the encapsulant material is a thermosetting material, and the heating includes curing the encapsulant material.

3. The method of claim 1, further comprising:

providing via holes in the structural layer to facilitate the outgassing of the sacrificial layer.

4. The method of claim 1, wherein the thermally decomposable material is photo-sensitive.

5. The method of claim 1, wherein the desired portion is a stress sensitive area of the integrated circuit die.

6. The method of claim 1, wherein the carrier is one of a leadframe having die attach pads, a ball grid array (BGA) substrate, or landed grid array (LGA) substrate.

7. The method of claim 1, further comprising:

partially dicing the wafer to form grooves between adjacent integrated circuit units before the coating of the thermally decomposable material, wherein the thermally decomposable material fills the grooves when coated on the wafer, wherein the sacrificial layer includes a top sacrificial layer covering the desired portion of the integrated circuit unit and a side portion filling the grooves, wherein in the sawing, the wafer is sawn through the groove such that the side portion in each groove is divided into respective side sacrificial layers for the adjacent dice, and wherein the air cavity formed by the heating includes a top air cavity under the structural layer and a side air cavity on a side of the die.

8. A method for creating an air cavity in a molding compound for an integrated circuit die, said method comprising:

partially dicing a wafer including a plurality of integrated circuit units on a top surface thereof to form grooves between adjacent integrated circuit units;

coating a thermally decomposable material on the wafer, the material filling the grooves;

patterning the coated material into a sacrificial layer including a top sacrificial layer covering a desired portion of the integrated circuit unit and a side portion filling the grooves;

sawing the wafer through the grooves to a wafer mount tape of the wafer into individual dice, each die including a corresponding integrated circuit unit, the side portion being divided into respective side sacrificial layers for adjacent dice;

stretching the wafer mount tape so as to create gaps between the adjacent dice;

coating a polymer material over the diced wafer, the polymer material filling the gaps between the dice;

patterning the polymer material into a structural layer including a top structural layer and a side structural layer, the top structural layer covering the sacrificial layer on each die, the side structural layer filling the gaps;

sawing through the side structural layer in the gap such that the side structural layer is divided into respective side walls for the adjacent dice;

attaching the dice on a carrier and providing electrical connections;

covering the wire-bonded die with an encapsulant material; and heating the encapsulant material, wherein the sacrificial layer decomposes and outgasses, thereby leaving a top air cavity under the top structural layer and a side air cavity between the die and the side wall.

9. The method of claim 8, wherein the encapsulant material is a thermosetting material, and the heating includes curing the encapsulant material.

10. The method of claim 8, further comprising:

providing via holes in the top structural layer to facilitate the outgassing of the sacrificial layer.

11. The method of claim 8, wherein the desired portion is a stress sensitive area of the integrated circuit die.

12. The method of claim 8, wherein the thermally decomposable material is photo-sensitive.

13. The method of claim 8, wherein the carrier is one of a leadframe having die attach pads, a ball grid array (BGA) substrate, or landed grid array (LGA) substrate.

* * * * *